United States Patent
Muroga et al.

(10) Patent No.: US 8,221,897 B2
(45) Date of Patent: Jul. 17, 2012

(54) ROLLED COPPER FOIL

(75) Inventors: Takemi Muroga, Tsuchiura (JP); Yasuyuki Ito, Tsuchiura (JP); Koji Aoyagi, Tsuchiura (JP); Yoshiki Yamamoto, Tsukuba (JP); Kenji Yokomizo, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 935 days.

(21) Appl. No.: 12/168,937

(22) Filed: Jul. 8, 2008

(65) Prior Publication Data

US 2009/0017325 A1    Jan. 15, 2009

(30) Foreign Application Priority Data

Jul. 11, 2007 (JP) ................... 2007-182093

(51) Int. Cl.
*B21C 37/00* (2006.01)
*C22C 9/00* (2006.01)
*C25D 7/04* (2006.01)

(52) U.S. Cl. .................. 428/606; 148/411; 420/469
(58) Field of Classification Search .................. 148/411; 420/469; 428/606
See application file for complete search history.

(56) References Cited

FOREIGN PATENT DOCUMENTS

| JP | 11-286760 | 10/1999 |
|----|-----------|---------|
| JP | 3009383 | 12/1999 |
| JP | 2000-212661 | 8/2000 |
| JP | 2000-256765 | 9/2000 |
| JP | 2001-262296 | 9/2001 |
| JP | 2001-323354 | 11/2001 |
| JP | 2005-068484 | 3/2005 |
| JP | 2006-117977 | 5/2006 |

*Primary Examiner* — Jessica L Ward
*Assistant Examiner* — Alexander Polyansky
(74) *Attorney, Agent, or Firm* — Antonelli, Terry, Stout & Kraus, LLP.

(57) ABSTRACT

A rolled copper foil according to the present invention includes a crystal grain alignment wherein: when normalized intensity of $\{200\}_{Cu}$ plane diffraction of a copper crystal in results obtained by an X-ray diffraction pole figure measurement with respect to a rolled surface is plotted against at different values of angle α, the normalized intensity being obtained during a β scanning in the pole figure measurement, a ratio of a maximum value A of the normalized intensity with angle α in a range of 40° to 60° to a maximum value B of the normalized intensity with angle α in a range of 80° to 90° is equal to or greater than 4; and when the normalized intensity increases with increasing angle α in a range of 25° to 45°, there is essentially no area in which the normalized intensity increases stepwise.

10 Claims, 6 Drawing Sheets

ROLLED COPPER FOIL

CLAIM OF PRIORITY

The present application claims priority from Japanese patent application serial no. 2007-182093 filed on Jul. 11, 2007, the content of which is hereby incorporated by reference into this application.

BACKGROUND OF THE INVENTION

1. Field of the Invention

The present invention concerns a rolled copper foil and, particularly, it relates to a rolled copper foil which has an excellent flexible fatigue property suitable for flexible wiring materials such as flexible printed circuits.

2. Description of Related Art

A flexible printed circuit (hereinafter simply referred to as FPC) has high freedom in a mounting form to electronic equipments due to their attractive features of small thickness and excellent flexibility. Accordingly, FPCs have been used generally, e.g., as wirings for bending portions of foldable (clamshell type) cellular phones, movable portions of digital cameras, printer heads, etc., and movable portions of equipment relevant to disks such as HDDs (hard disk drives), DVDs (digital versatile disks) and CDs (compact disks).

As conductors for FPC, pure copper or copper alloy foils (hereinafter simply referred to as "copper foils") applied with various surface treatments have been generally used. The copper foils are classified into electrodeposited copper foils and rolled copper foils according to the manufacturing methods thereof. Since FPCs are used as wiring materials for repetitive movable portions as described above, excellent flexible fatigue properties (e.g., flexible fatigue property of 1,000,000 cycles or more) have been required, and rolled copper foils are often selected as the copper foils.

Generally, the rolled copper foils are manufactured by applying a hot rolling step to a cast ingot made of a tough pitch copper (JIS H3100 C1100) or an oxygen-free copper (JIS H3100 C1020) as a raw material, and then by repeating a cold rolling step and a process annealing step until a predetermined thickness. The thickness of rolled copper foils required for using in FPCs is usually 50 µm or less and it has tended to be decreased further as 10 and several µm or less in recent years.

The FPC manufacturing step generally includes "a step of bonding a copper foil and a base film (base material) comprising a resin such as a polyimide to form a CCL (copper cladded laminate (CCL step))", "a step of forming a printed circuit by a method such as etching for CCL", "a step of applying a surface treatment on the circuit for protection of wirings", etc. The CCL step includes two kinds of methods, i.e., a method of laminating a copper foil and a base material with an adhesive and then curing and adhering the adhesive by a heat treatment (3-layered CCL), and a method of directly bonding a copper foil applied with a surface treatment to a base material without an adhesive and then integrating them by heating and pressing (2-layered CCL).

In the FPC manufacturing step, copper foils as cold rolled (hard state which is work hardened) has been often used from a viewpoint of easy handling. In a case where the copper foil is in an annealed (softened) state, the copper foil is easy to deform (e.g., elongation, creasing, flexing, etc.) upon cutting of the copper foil or lamination with the base material, resulting in product failure.

On the other hand, the flexible fatigue property of the copper foil is improved remarkably by applying a recrystallization annealing than that of the copper foil in the as-cold rolled state. Then, a manufacturing method has been generally selected in which the heat treatment for adhering the base material and the copper foil in the CCL step is also served for the recrystallization annealing for the copper foil. The heat treatment condition in this case is usually at a temperature of 180 to 300° C. for 1 to 60 min (e.g., at 200° C. for 30 min) and the copper foil is in a state refined into a recrystallization texture.

For improving the flexible fatigue property of FPCs, it is effective to improve the flexible fatigue property of the rolled copper foil as the material thereof. Further, it has been known that the flexible fatigue property of the copper foil after recrystallization annealing is improved more as a cubic texture is developed. "Development of the cubic texture" referred to generally only means that the occupation ratio of a $\{200\}_{Cu}$ plane is high at the rolled surface (e.g., 85% or more).

Heretofore, for rolled copper foils with excellent flexible fatigue property and manufacturing methods thereof, there have been reported as follows. They are: e.g., a method of developing the cubic texture by increasing a final rolling working ratio (e.g., 90% or more); a copper foil defined for the degree of development of the cubic texture after recrystallization annealing (e.g., the intensity of a $(200)_{Cu}$ plane determined by X-ray diffraction at the rolled surface is greater by more than 20 times than that determined by powder X-ray diffractometry); a copper foil defined for the ratio of penetration crystal grains in the direction of thickness of the copper foil (e.g., 40% or more as a cross sectional area ratio); a copper foil controlled for the softening temperature by the addition of small amount of additive elements (e.g., controlled to a half-softening temperature of 120 to 150° C.); a copper foil defined for the length of a twin boundary (e.g., the total length of the twin boundary with a length exceeding 5 µm per 1 mm² area is 20 mm or less); a copper foil controlled for the recrystallization texture by the addition of additive elements (e.g., the Sn is added by 0.01 to 0.2 mass % to control the average crystal grain size of 5 µm or less and the maximum crystal grain size of 15 µm or less), etc. (see JP-B-3009383, JP-A-2006-117977, JP-A-2000-212661, JP-A-2000-256765, JP-A-2001-323354, JP-A-2001-262296, and JP-A-2005-68484).

However, along with development in downsizing, increase in the integration degree (higher density mounting) and higher performance of electronic equipment in recent years, further higher requirement for flexible fatigue property has been increased more and more than usual for the FPC. Since the flexible fatigue property of the FPC is determined substantially depending on that of the copper foil, it is essential to further improve the flexible fatigue property of the copper foil for satisfying the demand.

SUMMARY OF THE INVENTION

Under these circumstances, it is an objective of the present invention to provide a rolled copper foil which has more excellent flexible fatigue property than usual and that is suitable to flexible wiring materials such as for flexible printed circuits (FPC).

As the results of detail analyzing the metal crystallographic studies on the rolled texture of a rolled copper foil by the inventors, it is clarified that there is a specific correlation among the state of crystal grain alignment of the rolled texture, that of the cubic texture after the recrystallization annealing, and the flexible fatigue property. Based on this finding, the present invention has been completed as described below.

(1) According to one aspect of the present invention, a rolled copper foil obtained after a final cold rolling step but before a recrystallization annealing includes a crystal grain alignment wherein:

when normalized intensity of $\{200\}_{Cu}$ plane diffraction of a copper crystal in results obtained by an X-ray diffraction pole figure measurement with respect to a rolled surface is plotted against at different values of angle α, the normalized intensity being obtained during a β scanning in the pole figure measurement, a ratio of a maximum value A of the normalized intensity with angle α in a range of 40° to 60° to a maximum value B of the normalized intensity with angle α in a range of 80° to 90° is equal to or greater than 4 (A/B≧4); and when the normalized intensity increases with increasing angle α in a range of 25° to 45°, there is essentially no area in which the normalized intensity increases stepwise.

In the above aspect of the present invention, the following modifications and changes can be made.

(i) In results obtained by an X-ray diffraction 2θ/θ measurement for the rolled surface, 80% or more of diffraction peaks of the copper crystal occurs on a $\{220\}_{Cu}$ plane.

(ii) The rolled copper foil is made of a copper alloy including Sn by 0.001 to 0.009 mass % and a balance comprising Cu and an inevitable impurity.

(iii) A rolled copper foil applied with the recrystallization annealing to the above rolled copper foil, which is obtained after the final cold rolling step but before the recrystallization annealing, includes a crystal grain alignment in which 90% or more of diffraction peaks of the copper crystal occurs on the $\{200\}_{Cu}$ plane in results obtained by an X-ray diffraction 2θ/θ measurement for the rolled surface.

ADVANTAGES OF THE INVENTION

According to the present invention, it is possible to provide a rolled copper foil suitable for a flexible wiring material such as a flexible printed circuit (FPC) and having more excellent flexible fatigue property than usual.

DETAILED DESCRIPTION OF THE PREFERRED EMBODIMENTS

Figure 1:
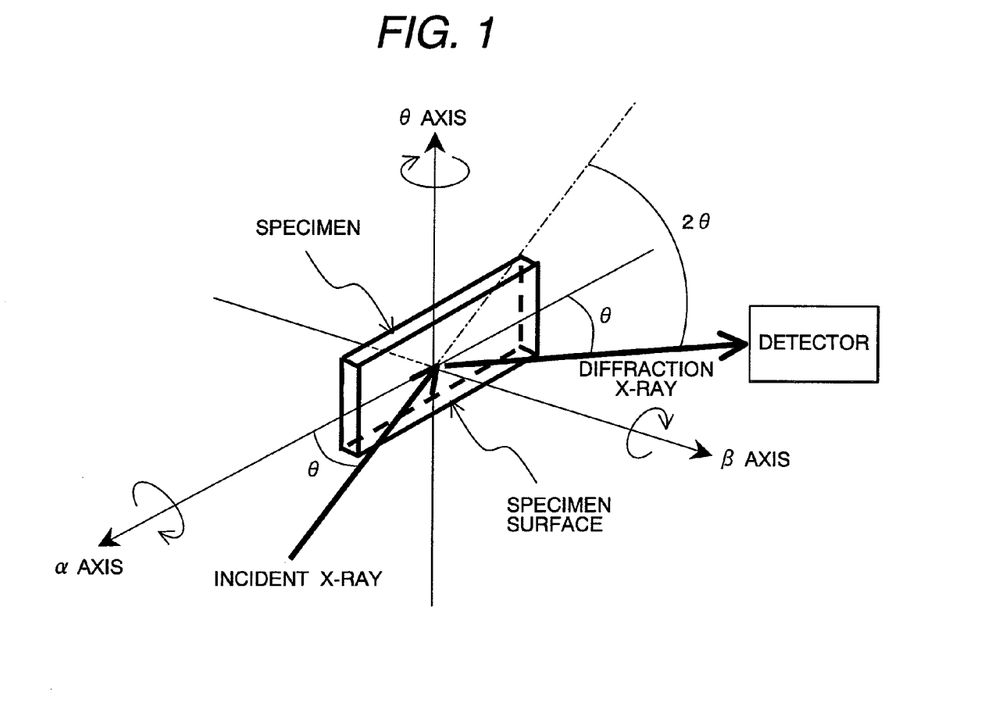
FIG. 1 is a schematic illustration showing a relationship among an incident X-ray, detector, specimen, and scanning axis in an X-ray diffractometer.

FIG. 1 is a schematic illustration showing a relationship among an incident X-ray, detector, specimen, and scanning axis in X-ray diffractometer. An evaluation (measurement) method for a state of the crystal grain alignment of a rolled copper foil by X-ray diffraction (XRD) will be described with reference to FIG. 1. Here, three scanning axis shown in FIG. 1 are generally referred to as a sample axis for the θ axis, a deflection axis for the α axis, and an in-plane rotation axis for the β axis. Further, the X-ray diffraction in the present invention is always conducted by using the Cu-Kα ray.

In an XRD 2θ/θ measurement, a specimen and a detector are scanned by the θ axis, wherein a scanning angle of the specimen is θ and that of the detector is 2θ. According to the 2θ/θ measurement, it can be estimated which crystal plane is a predominant plane at the specimen surface (rolled surface) of a polycrystalline rolled copper foil. In other words, an occupation ratio of the plane at the rolled surface can be evaluated.

In an XRD pole figure measurement, while a detector is fixed at the scanning angle of 2θ value of a certain plane $\{hkl\}_{Cu}$, a specimen is scanned stepwise by the α-axis and is rotated in-plane (in-plane rotation of 0° to 360°) by the β-axis for each of α-values. In the XRD pole figure measurement of the present invention, the normal direction to the specimen surface is defined as α=90° to be a reference for the measurement. Further, while the pole figure measurement includes a reflection method (α=15° to 90°) and a transmission method (α=0° to 15°), only the reflection method (α=15° to 90°) of the pole figure measurement is conducted in this invention.

First Embodiment of the Invention

A rolled copper foil obtained after a final cold rolling step but before a recrystallization annealing in this embodiment has a feature that the rolled copper foil includes a crystal grain alignment wherein: when normalized intensity of $\{200\}_{Cu}$ plane diffraction of a copper crystal in results obtained by an X-ray diffraction pole figure measurement with respect to a rolled surface is plotted against at different values of angle α, the normalized intensity being obtained during a β scanning in the pole figure measurement, a ratio of a maximum value A of the normalized intensity with angle α in a range of 40° to 60° to a maximum value B of the normalized intensity with angle α in a range of 80° to 90° is equal to or greater than 4 (A/B≧4); and when the normalized intensity increases with increasing angle α in a range of 25° to 45°, there is essentially no area in which the normalized intensity increases stepwise.

(Ratio of Normalized Intensity)

The normalized intensity $R_c$ means herein a number of counts averaging a diffraction intensity of a predetermined $\{hkl\}_{Cu}$ plane by β-axis scanning (in-plane rotation axis scanning) at respective angles α in the XRD pole figure measurement, which can be calculated according to the following equation (refer to the following literature for the details). Normalizing calculation is usually conducted using a computer.

$$R_c = I_c / I_{std}$$

Where $I_c$: corrected intensity (background correction, absorption correction), $I_{std}$: intensity for normalization determined by calculation.

(Document's Name) "RAD system, Application software, Texture analysis program handling manual (manual No. MJ201RE)" Rigaku Corp., pp. 22-23.

(Document's Name) "CN9258E101, RINT 2000 Series, Application software, Pole figure program handling manual (Manual No. MJ10102A01)" Rigaku Corp., pp. 8-10.

The diffraction intensity is used by normalization, so that comparison of specimens can be made while eliminating effects due to the difference of condition setting such as a tube voltage or a tube current upon the XRD measurement (no substantial apparatus dependence).

Now, rotation phenomenon of the copper crystal grain during rolling will be discussed. Stress applied during the rolling can be divided into a tensile stress component and a compression stress component with respect to a target. It is known that, in cold rolling for copper foil as well, the copper crystal in the copper foil rotates due to stress caused during rolling and forms a rolled texture as the rolling progresses. The rotational direction (direction of the alignment on the rolled surface) of the copper crystal with respect to the stress direction is generally the $\{220\}_{Cu}$ plane when the stress is compression stress or the $\{311\}_{Cu}$ plane or $\{211\}_{Cu}$ plane when the stress is tensile stress.

When rolling is controlled so that the compression stress becomes larger than the tensile stress, $\{220\}_{Cu}$ plane alignment (rolled texture) is formed. It is also known that $\{220\}_{Cu}$ plane alignment (rolled texture) formed on rolled copper foil encourages cubic texture formation by recrystallization annealing.

If, however, partial recrystallization (i.e., release of processing strain) occurs due to heat generated during the processing, copper crystal grains having the $\{220\}_{Cu}$ plane, which is substantially parallel to the rolled plane, may be lessened. On the other hand, even if recrystallization does not occur during the rolling, when the accumulated processing strain is insufficient (e.g., the degree of rolling reduction is small), the rotation of the copper crystal grain due to rolling does not reach the $\{220\}_{Cu}$ alignment but may stay near the $\{200\}_{Cu}$ alignment.

When α is within the range of 40° to 60°, normalized intensity A in the XRD pole figure measurement according to the present invention is diffraction intensity of the copper crystal $\{200\}_{Cu}$ plane corresponding to the rolled surface. This means that the normalized intensity A is normalized diffraction intensity of the $\{220\}_{Cu}$ plane on the rolled surface. The reason why the range of α is from 40° to 60° is that the rolled texture is formed due to the rotation of the copper crystal grain, so the copper crystal $\{220\}_{Cu}$ plane may often have a slight tilt with respect to the rolled surface.

The normalized intensity with α set to 90° is the diffraction intensity of the $\{200\}_{Cu}$ plane parallel to the rolled surface. It can be thought that there are also many copper crystals the $\{200\}_{Cu}$ plane of which has a slight tilt with respect to the rolled surface due to the same factor as described above. Accordingly, in the present invention, a range of α within which normalized intensity B is judged is selectively set to 80° to 90°.

As described above, A/B is a ratio of the maximum normalized intensity A of the $\{200\}_{Cu}$ plane with α in the range of 40° to 60° to the maximum normalized intensity B with α in the range of 80° to 90°. When A/B is greater than or equal to 4 (A/B≧4), the copper crystal $\{220\}_{Cu}$ plane is dominant on the rolled surface (with a slight tilt). That is, the rolled copper foil has a rolled texture with sufficiently accumulated processing strain.

When A/B is less than 4 (A/B<4), the rolled copper foil has a rolled texture with insufficiently accumulated processing strain or has an almost the same amount of accumulated processing strain as before. Accordingly, copper foil having better flexible fatigue property than before cannot be obtained. A/B is then set to a value greater than or equal to 4. A/B is preferably set to a value greater than or equal to 4.5 (A/B≧4.5), and more preferably set to a value greater than or equal to 5 (A/B≧5).

When the rotation of the copper crystal grain is insufficient and/or partial recrystallization occurs during rolling, there may be an area in which the normalized intensity changes stepwise or an area in which a local maximum value may appear when α is within the range of 25° to 45° (such an area is collectively called a stepwise increasing area). In this case as well, copper foil having better flexible fatigue property than before cannot be obtained. Accordingly, when the normalized intensity increases with increasing angle α, the stepwise increasing area should not be essential present.

Second Embodiment of the Invention

2θ/θ Measurement

A rolled copper foil obtained after a final cold rolling step but before a recrystallization annealing in this embodiment has a feature that 80% or more of diffraction peaks of the copper crystal occurs on a $\{220\}_{Cu}$ plane in results obtained by the XRD 2θ/θ measurement for the rolled surface, in addition to the first embodiment.

Figure 2:
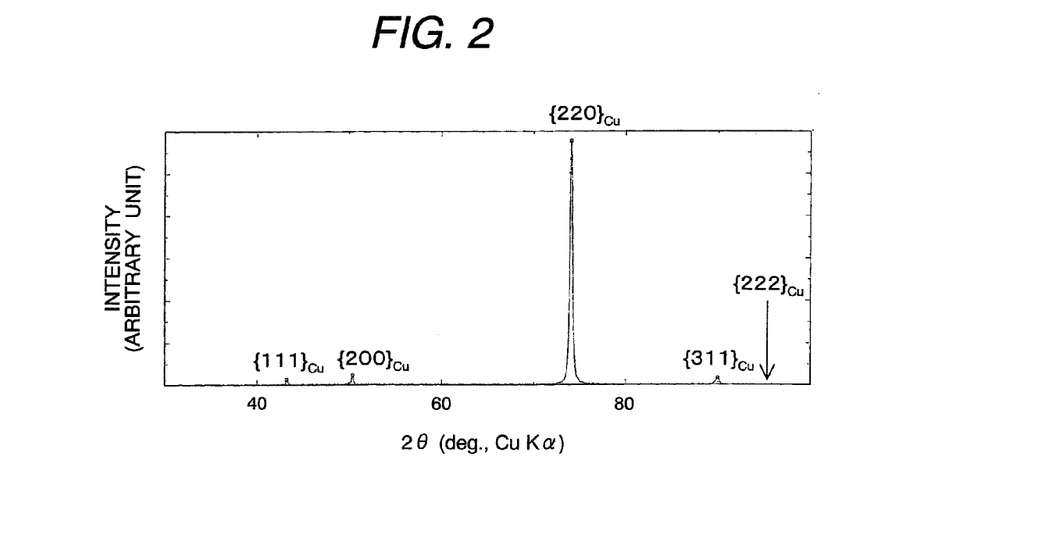
FIG. 2 is an example of a diffraction pattern by an X-ray diffraction 2θ/θ measurement for a rolled surface on a rolled copper foil obtained after a final cold rolling step but before a recrystallization annealing in a second embodiment of the present invention.

FIG. 2 shows an example of a diffraction pattern by the XRD 2θ/θ measurement for the rolled surface on a rolled copper foil obtained after a final cold rolling step but before a recrystallization annealing in a second embodiment of the present invention. As shown in FIG. 2, the rolled surface is strongly oriented to the $\{220\}_{Cu}$ plane and the occupation ratio of the $\{220\}_{Cu}$ plane thereof is 80% or more. This result shows that the rolled copper foil has a preferred rolled texture sufficiently accumulated processing strain by a cold rolling.

In a case where the occupation ratio of the $\{220\}_{Cu}$ plane is less than 80%, because of insufficient accumulation of processing strain, no higher flexible fatigue property than usual can be obtained in the rolled copper foil subsequently applied with the recrystallization annealing. Accordingly, the rolled copper foil satisfies that the occupation ratio of the $\{220\}_{Cu}$ plane thereof 80% or more, preferably 85% or more, and more preferably 90% or more.

The occupation ratio of the $\{220\}_{Cu}$ plane is defined as below.

Occupation ratio of $\{220\}_{Cu}$ plane (%)=$[I_{\{220\}Cu}/(I_{\{111\}Cu}+I_{\{200\}Cu}+I_{\{220\}Cu}+I_{\{311\}Cu})] \times 100$ in which $I_{\{200\}Cu}$: diffraction peak intensity of $\{200\}_{Cu}$ plane;
$I_{\{111\}Cu}$: diffraction peak intensity of $\{111\}_{Cu}$ plane;
$I_{\{220\}Cu}$: diffraction peak intensity of $\{220\}_{Cu}$ plane;
$I_{\{311\}Cu}$: diffraction peak intensity of $\{311\}_{Cu}$ plane.

Third Embodiment of the Invention

Copper Alloy Composition of Rolled Copper Foil

A rolled copper foil in this embodiment has a feature that the rolled copper foil is made of a copper alloy including Sn by 0.001 to 0.009 mass % and a balance consisting of Cu and an inevitable impurity. The reasons for adding the alloy elements to compose the copper alloy material of the rolled copper foil and for limiting the content thereof are as follows.

For the rolled copper foil, as the total working ratio in the final cold rolling step is larger (e.g., 90% or more), it tends to cause the natural softening (cold softening). In a case where the undesired phenomenon (cold softening) occurs, deformation of a copper foil arises easily during cutting of the copper foil or laminating with a base material in the FPC manufacturing step, and thus the production yield of FPC will be lowered.

The Sn addition to the Cu has an effect to suppress the cold softening phenomenon (to control the softening temperature or the recrystallization starting temperature) even though a strong working is applied in the final cold rolling step. "Cold softening" includes herein a partial recrystallization phenomenon during the cold rolling.

The softening temperature of the rolled copper foil increases with increasing the Sn content. In a case where the Sn content is less than 0.001 mass %, it is difficult to control the softening temperature to be desired. Further, in a case where the Sn content is more than 0.009 mass %, the softening temperature is excessively high, making the recrystallization annealing in aforementioned CCL step to be difficult, and also it causes a disadvantage of lowering the electrical conductivity. Accordingly, the Sn content of the copper alloy for the rolled copper foil is defined as 0.001 to 0.009 mass %, preferably 0.002 to 0.008 mass %, and more preferably 0.003 to 0.007 mass %.

(Manufacturing Method of Rolled Copper Foil)

Figure 3:
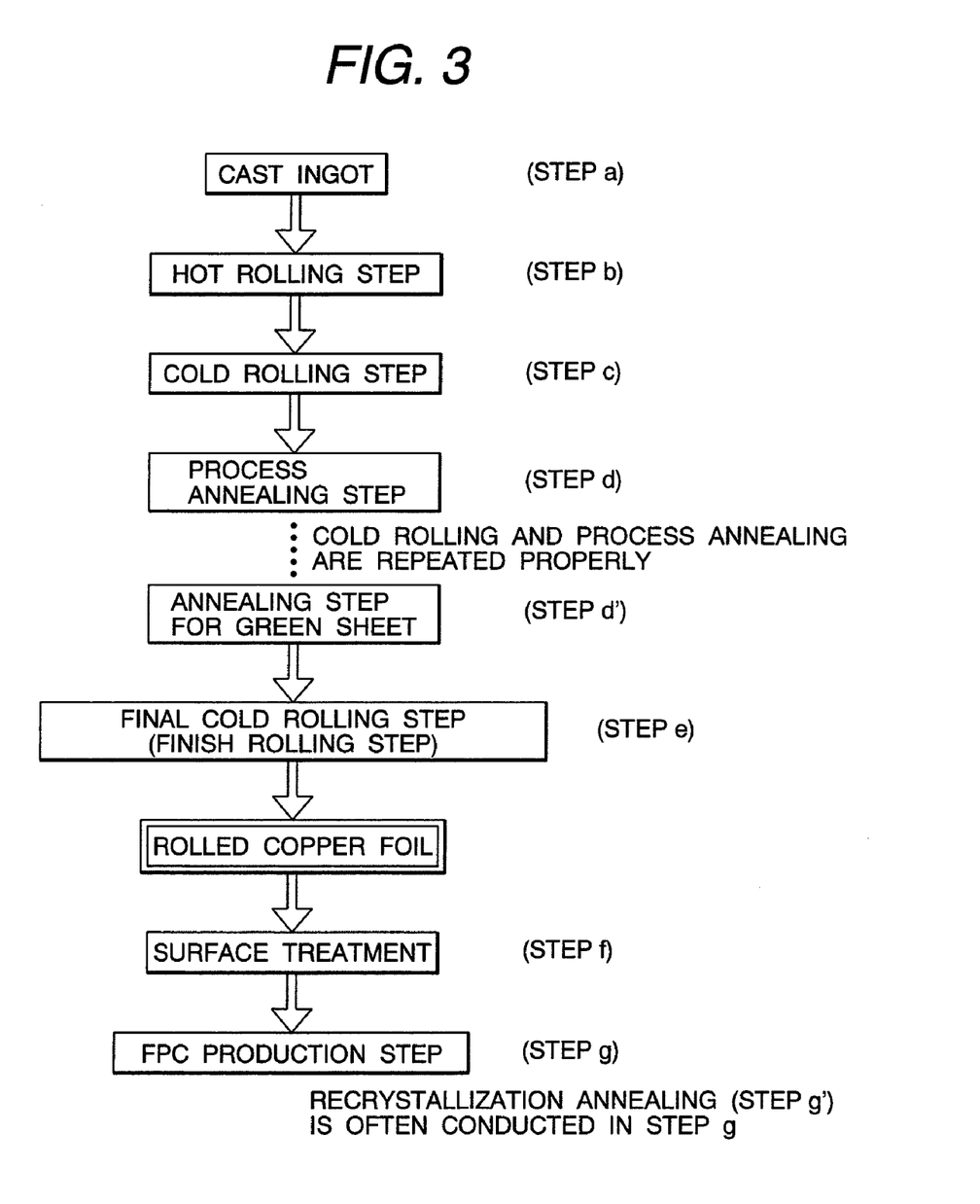
FIG. 3 is a flowchart showing steps of manufacturing a rolled copper foil according to a preferred embodiment of the present invention.

Next, manufacturing method of the rolled copper foil according to a preferred embodiment of the present invention will be described with reference to FIG. 3. FIG. 3 is a flowchart showing steps of manufacturing a rolled copper foil according to a preferred embodiment of the present invention.

At first, is prepared an ingot (cast ingot) made of a tough pitch copper (JIS H3100 C1100), an oxygen-free copper (JIS H3100 C1020), or the copper alloy described above as a starting material (step a). Next, a hot rolling step which the cast ingot thus formed is hot-rolled (step b) is conducted. After the hot rolling step, a cold rolling step which the hot-rolled plate thus formed is cold-rolled (step c) and a process annealing step that the work hardening by the cold rolling is relaxed (step d) are conducted, where steps c and d are properly repeated, to produce a rolled copper sheet just before a final cold rolling step referred to as "green sheet". Then, "annealing step for green sheet" (step d'), which is the process annealing step just before the final cold rolling step, is carried out. In the "annealing step for green sheet", it is desired that the previous working strain is relaxed sufficiently (e.g., almost full annealing).

After that, the final cold rolling step (step e, also sometimes referred to as "finish rolling step") is applied to the "green sheet" to produce a rolled copper foil of a predetermined thickness for FPC. The rolled copper foil after the final cold rolling step is applied optionally with a surface treatment, etc. (step f), and is supplied to an FPC manufacturing step (step g). As mentioned before, the recrystallization annealing (step g') is often conducted during the step g (e.g., CCL step).

Fourth Embodiment of the Invention

2θ/θ Measurement

A rolled copper foil in this embodiment has a feature that the rolled copper foil applied with a recrystallization annealing to the aforementioned rolled copper foil, which is obtained after the final cold rolling step but before the recrystallization annealing, includes a crystal grain alignment in which 90% or more of diffraction peaks of the copper crystal occurs on the $\{200\}_{Cu}$ plane in results obtained by an X-ray diffraction 2θ/θ measurement for the rolled surface.

Figure 4:
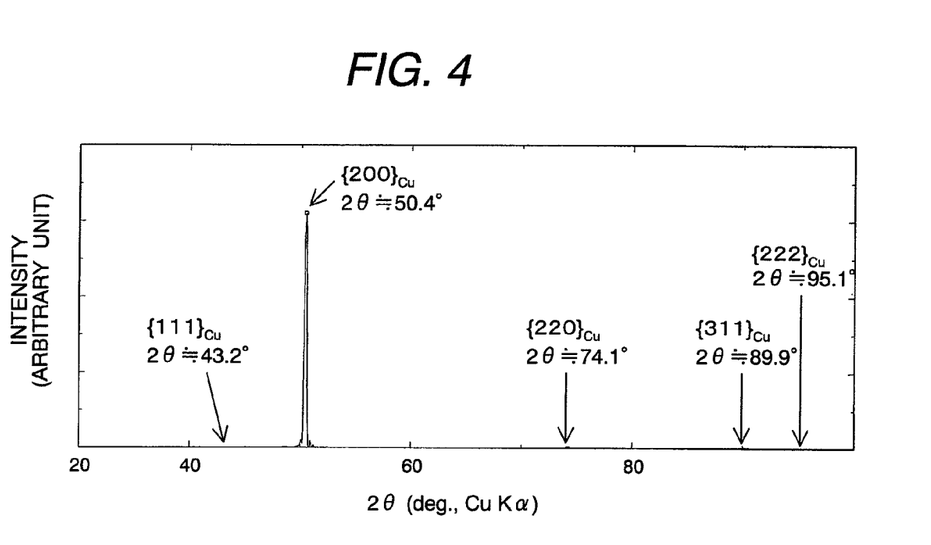
FIG. 4 is an example of a diffraction pattern by an X-ray diffraction 2θ/θ measurement for a rolled surface on a rolled copper foil applied with a recrystallization annealing after a final cold rolling step in a fourth embodiment of the present invention.

FIG. 4 is an example of a diffraction pattern by an X-ray diffraction 2θ/θ measurement for a rolled surface on a rolled copper foil applied with a recrystallization annealing after a final cold rolling step in a fourth embodiment of the present invention. As shown in FIG. 4, the rolled surface is strongly oriented to the $\{200\}_{Cu}$ plane of the recrystallized grains and the occupation ratio of the $\{200\}_{Cu}$ plane thereof is 90% or more.

In a case where the occupation ratio of the $\{200\}_{Cu}$ plane diffraction among the diffraction peaks is less than 90%, no higher flexible fatigue property than usual can be obtained. Accordingly, the rolled copper foil satisfies that the occupation ratio of the $\{200\}_{Cu}$ plane thereof is 90% or more, preferably 92% or more, and more preferably 94% or more.

Here, the occupation ratio of the $\{200\}_{Cu}$ plane is defined as below:

Occupation ratio of $\{200\}_{Cu}$ plane (%)=$[I_{\{200\}Cu}/\{I_{\{111\}Cu}+I_{\{200\}Cu}+I_{\{220\}Cu}+I_{\{311\}Cu}\}] \times 100$ (Discussion on Mechanism of Improving Flexible Fatigue Property)

The mechanism for improving the flexible fatigue property of the rolled copper foil in a preferred embodiment according to the present invention is to be discussed.

When a stress is applied on metal crystals, dislocations tend to move along the slip plane of crystals. However, a crystal grain boundary generally plays a barrier to the movement of the dislocation. In a polycrystalline rolled copper foil, when dislocations are concentrated to the grain boundary, etc. due to bending motion, it is considered that a crack formation will be occurred at the concentrated portion to cause so-called metal fatigue. In other words, it is expected that the flexible fatigue property can be improved in the polycrystalline body if the concentration of the dislocations can be suppressed.

The rolled copper foil in this embodiment suggests that when the rolled texture is controlled, the cubic texture after recrystallization can be controlled. It can be considered that when recrystallization occurs and thus a cubic texture for which the alignment of the $\{111\}_{Cu}$ plane, which is a slip plane specific to the face-centered cubic structure of the copper crystal, is well controlled (i.e., slip directions are well aligned) is obtained. Then, dislocation may be highly likely to cause a cross slip during bending motion and thereby a high flexible fatigue property may be obtained. It is strongly suggested that the flexible fatigue property of the copper foil after recrystallization annealing can be indirectly evaluated when a crystal grain alignment of the copper foil after final rolling but before recrystallization annealing (a state in which a rolled texture is formed) is controlled.

Other Embodiments

In the step a, there are no restrictions on the melting and casting methods and also on the size of the starting materials. Also, there are no particular restrictions on the step b, step c, and the step d; usual methods and conditions may be employed. Further, the thickness of the rolled copper foil used for FPC is generally 50 μm or less and there are no particular restrictions also on the thickness of the rolled copper foil of the present invention so long as it is 50 μm or less.

[Manufacturing of Flexible Printed Circuit]

A flexible printed circuit can be obtained by the conventional manufacturing method using the rolled copper foil of the preferred embodiments described above. Further, the recrystallization annealing to the rolled copper foil may be a heat treatment conducted in the usual CCL step or it may be conducted in a separated step.

[Advantages of the Embodiments]

The embodiments of the present invention have the following advantages:

(1) A rolled copper foil having more excellent flexible fatigue property than usual can be obtained;

(2) A rolled copper foil having more excellent flexible fatigue property than usual can be manufactured stably;

(3) Flexible wirings such as for flexible printed circuits (FPC) having more excellent flexible fatigue property than usual can be obtained; and (4) It can be applied not only to flexible printed circuits (FPC) but also other conductive members requiring high flexible fatigue property (flexible fatigue life), etc.

Examples of the present invention will be described below. However, the present invention is not limited to the examples described herein.

EXAMPLES

Manufacturing of Example 1 and Comparative Examples 1 to 3

At first, a cast ingot made of an oxygen-free copper (oxygen content: 2 ppm) with a thickness of 200 mm and a width of 650 mm was prepared as a starting material. In accordance with the flow chart as shown in FIG. 3, the cast ingot was hot-rolled down to a thickness of 10 mm. Then, the cold rolling step and process annealing step were properly repeated to prepare the green sheets having two kinds of thickness of 0.8 mm and 0.2 mm. For the annealing step for green sheet, the green sheets were held at a temperature of 700° C. for about 1 min.

Rolled foils with a thickness of 16 μm (Example 1 and Comparative examples 1 to 3) were prepared by executing the final cold rolling under the conditions shown in Table 1. "10th pass and later: including 10% to 14%" in "Working ratio in one rolling pass" indicated in Example 1 in the table indicates rolling in which the working ratio is from 10% to 14% is included at least once in the tenth pass and later. Five specimens were prepared for each example (rolled foil).

TABLE 1

Condition in final cold annealing step.

| | Thickness of green sheet | Working ratio in one rolling pass | Total working ratio |
|---|---|---|---|
| Example 1 | 0.8 mm | 1st to 3rd passes: 30% to 60% 4th to 6th passes: 20% to 50% 7th to 9th passes: 15% to 30% 10th pass and later: including 10% to 14% | About 98% |
| Comparative example 1 | | 1st to 3rd passes: 30% to 60% 4th to 6th passes: 20% to 50% 7th pass and later: including 15% to 30% | |
| Comparative example 2 | 0.2 mm | 1st and 2nd passes: 30% to 60% 3rd and 4th passes: 15% to 30% 5th pass and later: including 10% to 30% | About 92% |
| Comparative example 3 | | 1st and 2nd passes: 30% to 60% 3rd pass and later: including 15% to 30% | |

(XRD Measurement for Rolled Copper Foil After Final Cold Rolling Step)

The XRD measurements were conducted for the rolled copper foils with a thickness of 16 μm after the final cold rolling step (and before the recrystallization annealing). For various XRD measurements (pole figure measurement and 2θ/θ measurement), an X-ray diffraction apparatus (manufactured by Rigaku Corp. Model: RAD-B) was used. The Cu was used as an anticathode (target), and then a tube voltage and a tube current were set to be 40 kV and 30 mA, respectively. Further, the size of a specimen served for the XRD measurement was about 15× about 15 mm$^2$.

In the XRD pole figure measurement, the $\{200\}_{Cu}$ plane diffraction was measured by using a general Schultz reflection method while scanning the β-axis (in-plane rotation of 0° to 360°) on every 1° step in the range of α=15° to 90° (α=90° is defined as the normal direction to the rolled surface). 2θ value was set to 2θ≈50°, which was a result of preliminary measurement on every specimen. The slit conditions used were diverging slit=1°, scatting slit=7 mm, photoreceiving slit=7 mm, and Schultz slit (slit height of 1 mm).

The XRD 2θ/θ measurement was conducted by using a general wide angle goniometer under the condition within a range of 2θ=30° to 100°. The slit conditions of the 2θ/θ measurement were a diverging slit of 1°, a photoreceiving slit of 0.15 mm, and a scattering slit of 1°.

Figure 5:
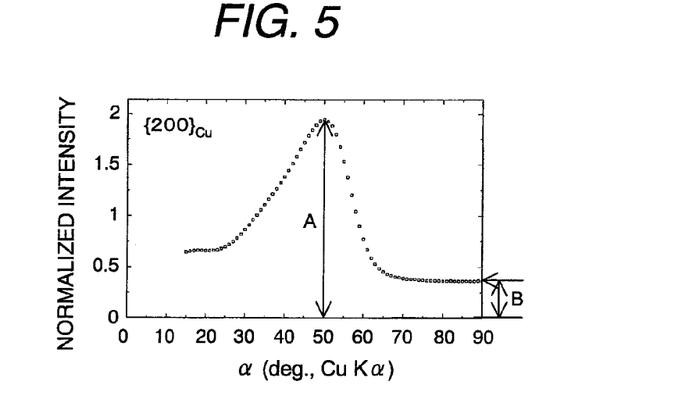
FIG. 5 is an example of normalized intensity of a $\{200\}_{Cu}$ plane diffraction as a function of α angle obtained by β scanning in an XRD pole figure measurement with respect to a rolled surface on a rolled copper foil obtained after a final cold rolling step but before a recrystallization annealing in Example 1.
Figure 6A:
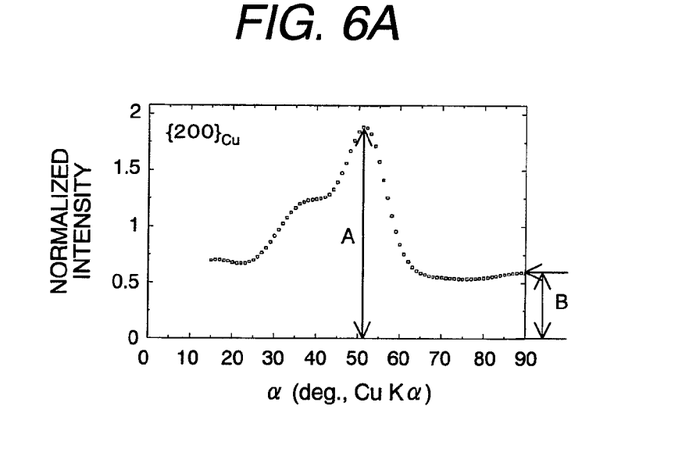
FIG. 6A is an example of normalized intensity of a $\{200\}_{Cu}$ plane diffraction as a function of α angle obtained by β scanning in an XRD pole figure measurement with respect to a rolled surface on a rolled copper foil obtained after a final cold rolling step but before a recrystallization annealing in Comparative example 1.
Figure 6B:
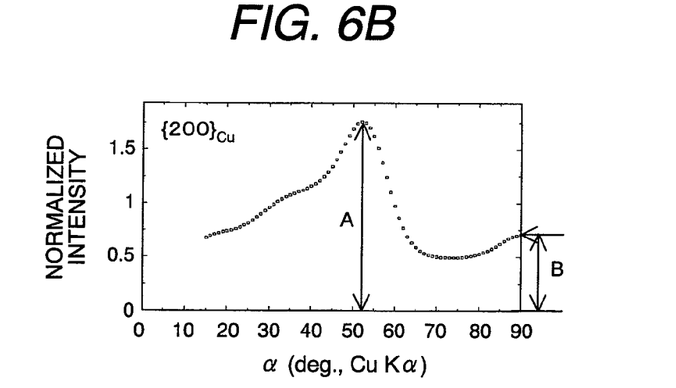
FIG. 6B is an example of that in Comparative example 2.
Figure 6C:
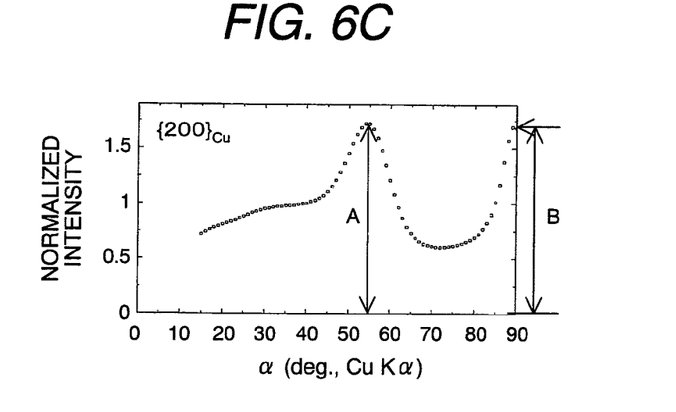
FIG. 6C is an example of that in Comparative example 3.

FIG. 5 shows an example of normalized intensity of a $\{200\}_{Cu}$ plane diffraction as a function of α angle obtained by β scanning in an XRD pole figure measurement with respect to a rolled surface on a rolled copper foil obtained after a final cold rolling step but before a recrystallization annealing in Example 1. FIG. 6A is also an example of normalized intensity of a $\{200\}_{Cu}$ plane diffraction as a function of α angle obtained by β scanning in an XRD pole figure measurement with respect to a rolled surface of a rolled copper foil obtained after a final cold rolling step but before a recrystallization annealing in Comparative example 1; FIG. 6B is an example of that in Comparative example 2; and FIG. 6C is an example of that in Comparative example 3. Table 2 shows the maximum value A of the normalized intensity when α is within the range of 40° to 60°, the maximum value B of the normalized intensity when α is within the range of 80° to 90°, and their ratio A/B (the values in Table 2 are averages taken for the five specimens in each example).

TABLE 2

Maximum value A with α in range of 40° to 60°, maximum value B with α in range of 80° to 90°, and ratio A/B thereof.

|  | A | B | A/B |
|---|---|---|---|
| Example 1 | 2.0 | 0.37 | 5.4 |
| Comparative example 1 | 1.9 | 0.59 | 3.2 |
| Comparative example 2 | 1.8 | 0.71 | 2.5 |
| Comparative example 3 | 1.7 | 1.7 | 1.0 |

As is clear from FIG. 5, FIGS. 6A to 6C, and Table 2, A/B was equal to or greater than 4 in Example 1, but smaller than 4 in Comparative examples 1 to 3. With α in the range of 25° to 45°, Example 1 essentially included no area in which the normalized intensity increased stepwise with increasing angle α, and Comparative examples 1 to 3 clearly included an area in which the normalized intensity increased stepwise or as if a shelf were formed.

A possible factor by which an area in which A/B was smaller than 4 and/or the normalized intensity increased stepwise was caused is that insufficient accumulation of processing strain or partial recrystallization was caused in the final cold rolling step (see Table 1), so the rotation of the copper crystal was insufficient or processing strain was partially released. By comparison, in Example 1, it can be considered that because passes controlled so that the working ratio fell within the range of 10% to 14% were included in the tenth pass and later, the partial recrystallization was suppressed and that the accumulation of processing strain was sufficiently increased.

Figure 7A:
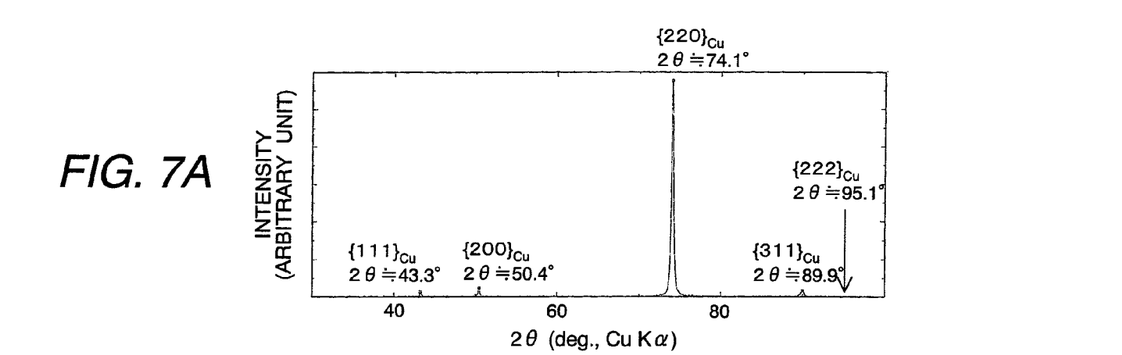
FIG. 7A is an example of a diffraction pattern by an X-ray diffraction 2θ/θ measurement for a rolled surface on a rolled copper foil obtained after a final cold rolling step but before a recrystallization annealing in Example 1.
Figure 7B:
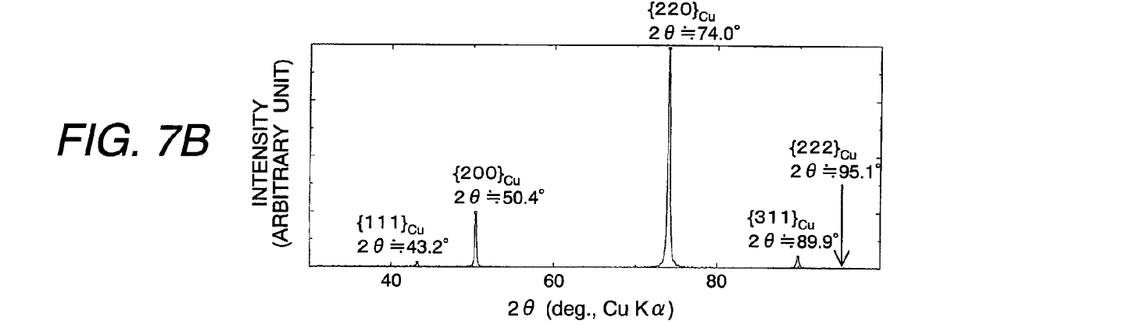
FIG. 7B is an example of that in Comparative example 1.
Figure 7C:
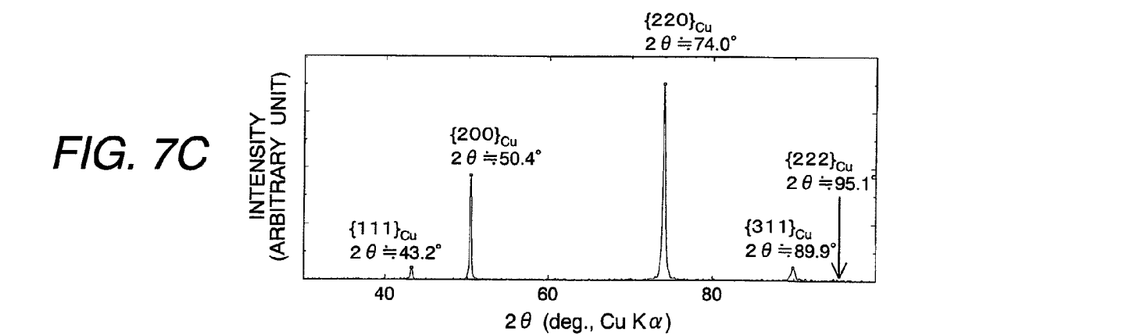
FIG. 7C is an example of that in Comparative example 2.
Figure 7D:
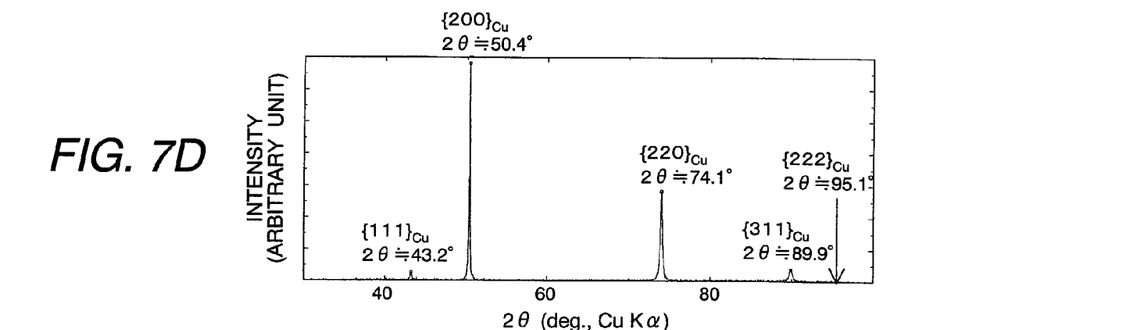
FIG. 7D is an example of that in Comparative example 3.

FIG. 7A shows an example of a diffraction pattern by an X-ray diffraction 2θ/θ measurement for a rolled surface on a rolled copper foil obtained after a final cold rolling step but before recrystallization annealing in Example 1; FIG. 7B is an example of that in Comparative example 1; FIG. 7C is an example of that in Comparative example 2; and FIG. 7D is an example of that in Comparative example 3. Table 3 shows relative intensity to the strongest diffraction peak being defined as 100, as well as the occupation ratio of the $\{220\}_{Cu}$ plane (the values in the table are averages taken for the five specimens in each example).

TABLE 3

Relative intensity to strongest diffraction peak being defined as 100, as well as occupation ratio of $\{220\}_{Cu}$ plane.

|  | $\{111\}_{Cu}$ | $\{200\}_{Cu}$ | $\{220\}_{Cu}$ | $\{311\}_{Cu}$ | Occupation ratio of $\{220\}_{Cu}$ plane |
|---|---|---|---|---|---|
| Example 1 | 2 | 4 | 100 | 3 | About 92% |
| Comparative example 1 | 2 | 25 | 100 | 5 | About 76% |
| Comparative example 2 | 6 | 53 | 100 | 6 | About 61% |
| Comparative example 3 | 4 | 100 | 41 | 6 | About 27% |

As is clear from FIGS. 7A to 7D and Table 3, a rolled texture strongly aligned to the $\{220\}_{Cu}$ plane (the occupation ratio of the $\{220\}_{Cu}$ plane is about 92%) was formed in Example 1. By comparison, in Comparative examples 1 to 3, the $\{200\}_{Cu}$ plane was strongly detected and the occupation ratio of the $\{220\}_{Cu}$ plane was lower than 80%.

(XRD Measurement for Rolled Copper Foil After Recrystallization Annealing)

The rolled copper foils manufactured as described above (16 μm thickness, as cold rolled in the final cold rolling step) were heated up to a temperature of 180° C. and held for 60 min as a recrystallization annealing. After the recrystallization annealing, the crystal grain alignment of each foils was evaluated by the XRD 2θ/θ measurement. When the occupation ratio of the $\{200\}_{Cu}$ plane of the cubic texture was evaluated (average of each five specimens), it was about 94% for Example 1, about 91% for Comparative example 1, about 89% for Comparative example 2, and about 88% for Comparative example 3.

(Flexible Fatigue Property of Rolled Copper Foil After Recrystallization Annealing)

Figure 8:
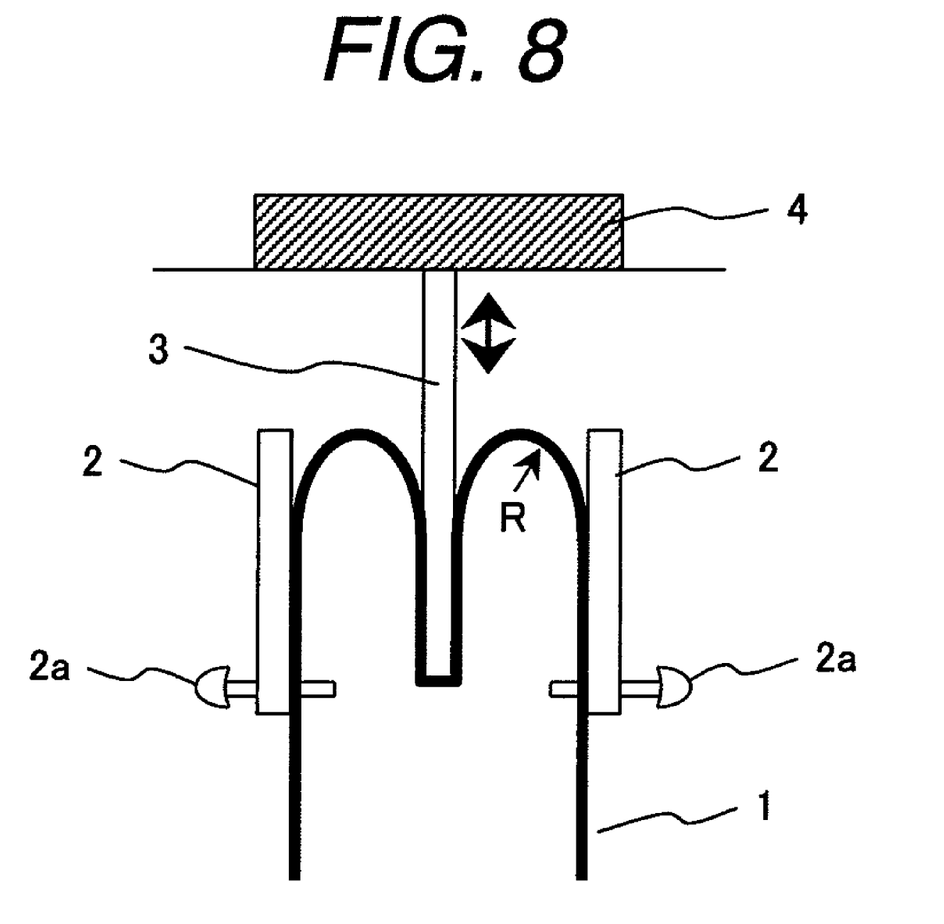
FIG. 8 is a schematic illustration showing an outline of flexible fatigue property measurement (IPC-based fatigue test).

The flexible fatigue property of the rolled copper foils (16 μm thickness, after recrystallization annealing) was evaluated as described below. FIG. 8 is a schematic illustration showing an outline for flexible fatigue property measurement (IPC-based fatigue test). A IPC-based fatigue test apparatus (model: SEK-31B2S manufactured by Shinetsu Engineering Co.) was used, and the flexible fatigue property was measured under the conditions of R=2.5 mm, an amplitude stroke=10 mm, frequency=25 Hz (amplitude velocity=1500 cycles/min), specimen width=12.5 mm, specimen length=220 mm, and the longitudinal direction of a specimen being as the rolling direction. The results are shown in Table 4.

TABLE 4

Result of IPC-based fatigue test for rolled copper foil (oxygen-free copper) after recrystallization annealing (average of five specimens respectively).

|  | Number of cycles to failure (Cycles until rupture of bent portion) |
|---|---|
| Example 1 | $6.6 \times 10^6$ |
| Comparative example 1 | $3.2 \times 10^6$ |
| Comparative example 2 | $1.0 \times 10^6$ |
| Comparative example 3 | $0.9 \times 10^6$ |

As is clear from Table 4, the rolled copper foil in Example 1 had a flexible fatigue life at least two times as long as those in Comparative examples 1 to 3 (the rolled copper foil in Example 1 had higher flexible fatigue property). A possible factor for this longer flexible fatigue life is that because the crystal grain alignment of the rolled texture was controlled, alignment on the slip plane of the cubic texture after recrystallization was well controlled.

(Manufacturing of Examples 2 to 3 and Comparative Example 4)

As the starting materials, a copper alloy with addition of 0.004 mass % Sn to the oxygen-free copper (oxygen content: 2 ppm) (Example 2), a copper alloy with addition of 0.007 mass % Sn to the oxygen-free copper (Example 3), and a copper alloy with addition of 0.01 mass % Sn to the oxygen-free copper (Comparative example 4) were melted and then cast into the ingots with 200 mm thickness and 650 mm width, respectively. Then, in accordance with the flow chart as shown in FIG. 3, each cast ingots was hot-rolled down to a thickness of 10 mm. Then, the cold rolling step and process annealing step were properly repeated to produce the green sheet having a thickness of 0.8 mm. Each green sheet was held at a temperature of 700° C. for about 1 min as the annealing step for the green sheet.

Then, rolled copper foils with a thickness of 16 μm (Examples 2 to 3 and Comparative Example 4) were manufactured by conducting the final cold rolling step under the same conditions in Example 1 (refer to Table 1). Five specimens in each example (including comparative example) were manufactured in the same manner as described above. For the rolled copper foils (after the final cold rolling), when the XRD pole figure measurement of the $\{200\}_{Cu}$ plane and the XRD 2θ/θ measurement to the rolled surface were conducted, almost the same results as those in FIG. 5 and FIG. 7(a) were obtained.

The softening temperature of the rolled copper foils (Examples 2 to 3 and Comparative example 4) was investigated. The softening temperature was estimated based on the tensile strength by using a universal testing instrument (model: AG-I, manufactured by Shimadzu Corporation) according to the tensile test method of JIS Z 2241. At first, the foils were cut each into a rectangular form with a width of 15 mm and a length of 200 mm (longitudinal direction=rolling direction). Then, a heat treatment was applied to each of the cut-out specimens for 30 min at each of the temperatures of 50° C., 100° C., 130° C., 160° C., 180° C., 200° C., 220° C., 240° C., 260° C., 280° C., 300° C., 320° C., 340° C., and 360° C. Then, the tensile strength for each specimen after the heat treatment was measured. And the temperature at which decrease of the strength was substantially saturated (about 110 to 150 N/mm²) was defined as the softening temperature (tensile strength of rolled copper foil before the heat treatment was about 380 to 480 N/mm²).

As a result of the investigation described above (average of five specimens respectively), the softening temperature of Example 2 was about 180° C.; that of Example 3 was about 260° C.; and that of Comparative example 4 was about 320° C. The softening temperature of the rolled copper foil made of the oxygen-free copper without the Sn addition (Example 1) was about 100° C.

After applying a heat treatment to the rolled copper foils under the condition assuming the recrystallization annealing in the CCL step (holding at a temperature of 300° C. for 10 min), the flexible fatigue property measurement (IPC-based fatigue test) same as described above was conducted. Table 5 shows the results of the flexible fatigue property.

TABLE 5

Result of IPC-based fatigue test for rolled copper foil (copper alloy) after heat treatment (average of five specimens respectively).

| | Number of cycles to failure (Cycles until rupture of bent portion) |
|---|---|
| Example 2 | $6.7 \times 10^6$ |
| Example 3 | $6.1 \times 10^6$ |
| Comparative example 4 | $0.2 \times 10^6$ |

In view of the above results, because the rolled copper foils in Examples 2 and 3 underwent crystal grain alignment in the rolled texture, alignment on the slip plane of the cubic texture after recrystallization was well controlled, so it can be considered that these rolled copper foils exhibited a flexible fatigue life at least two times as long as those in the conventional rolled copper foils in Comparative examples 1 to 3 (the rolled copper foils in Examples 2 and 3 had higher flexible fatigue property).

In Comparative example 4 in which much more Sn than required by the present invention was included, the flexible fatigue property was worse than that of the conventional rolled foils in Comparative examples 1 to 3. A possible reason for the worse flexible fatigue property is that because the content of the Sn component was too much to perform sufficient recrystallization annealing and thereby a cubic texture could not develop sufficiently. The softening temperature of rolled copper foil is preferably 300° C. or lower from the viewpoint of practical use, and the above results indicate that the content of the Sn component is preferably 0.009 mass % or less.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A rolled copper foil obtained after a final cold rolling step but before a recrystallization annealing step, and having a crystal grain alignment
   in which, in results obtained by an X-ray diffraction pole figure measurement with respect to a rolled surface of the rolled copper foil, the crystal grain alignment indicates a ratio of A/B≧4, where A and B are local maximum values of normalized intensities of a $\{200\}_{Cu}$ plane diffraction of a copper crystal, which are respectively obtained by β-scanning of an in-plane rotation axis within an α-angle range of a deflection axis from 40° to 60° and another α-angle range from 80° to 90°; and
   there is essentially no area increasing the normalized intensity of the $\{200\}_{Cu}$ plane diffraction stepwise from α-angle of 25° to α-angle of 45°.

2. The rolled copper foil according to claim 1, wherein:
   in results obtained by an X-ray diffraction 2θ/θ measurement for the rolled surface, 80% or more of diffraction peaks of the copper crystal occurs on a $\{220\}_{Cu}$ plane.

3. The rolled copper foil according to claim 1, wherein:
   the rolled copper foil is made of a copper alloy including Sn by 0.001 to 0.009 mass % and a balance comprising Cu and an inevitable impurity.

4. The rolled copper foil according to claim 1, including a crystal grain alignment wherein:
   in results obtained by an X-ray diffraction 2θ/θ measurement for the rolled surface after having been subjected to the recrystallization annealing step, 90% or more of diffraction peaks of the copper crystal occurs on the $\{200\}_{Cu}$ plane.

5. The rolled copper foil according to claim 1, wherein:
   the rolled copper foil is made of a tough pitch copper or an oxygen-free copper.

6. A polycrystalline copper foil having a crystal grain alignment, in which, in results obtained by an X-ray diffraction pole figure measurement with respect to a surface of the polycrystalline copper foil, the crystal grain alignment indicates a ratio of A/B≧4, where A and B are local maximum values of normalized intensities of a $\{200\}_{Cu}$ plane diffraction of a copper crystal, which are respectively obtained by βscanning of an in-plane rotation axis within an α-angle range of a deflection axis from 40 to 60° and another a-angle from 80° to 90°; and
   the normalized intensity of the $\{200\}_{Cu}$ plane diffraction increases monotonously and an inclination of a curve of the normalized intensities does not decrease from α-angle of 25° to α-angle of 45°.

7. The polycrystalline copper foil according to claim 6, wherein:
in results obtained by an X-ray diffraction 2θ/θ measurement for the rolled surface, 80% or more of diffraction peaks of the copper crystal occurs on a $\{220\}_{Cu}$ plane.

8. The polycrystalline foil according to claim 6, wherein:
the rolled copper foil is made of a copper alloy including Sn by 0.001 to 0.009 mass % and a balance comprising Cu and an inevitable impurity.

9. A polycrystalline foil applied with the recrystallization annealing to the rolled copper foil according to claim 6, including a crystal grain alignment wherein:
in results obtained by an X-ray diffraction 2θ/θ measurement for the rolled surface, 90% or more of diffraction peaks of the copper crystal occurs on the $\{200\}_{Cu}$ plane.

10. The polycrystalline foil according to claim 6, wherein:
the rolled copper foil is made of a tough pitch copper or an oxygen-free copper.

* * * * *